United States Patent [19]

Goenka et al.

[11] Patent Number: 5,320,273
[45] Date of Patent: Jun. 14, 1994

[54] GAS FLOW DISTRIBUTION SYSTEM FOR MOLTEN SOLDER DISPENSING PROCESS

[75] Inventors: Lakhi N. Goenka, Ann Arbor; Vivek A. Jairazbhoy, Farmington Hills, both of Mich.

[73] Assignee: Ford Motor Company, Dearborn, Mich.

[21] Appl. No.: 100,833

[22] Filed: Aug. 2, 1993

[51] Int. Cl.5 ............................................ B23K 3/06
[52] U.S. Cl. ............................... 228/33; 228/42; 228/52; 222/603
[58] Field of Search ............ 228/33, 42, 52, 180.21, 228/219, 256; 222/591, 603

[56] References Cited

U.S. PATENT DOCUMENTS

| | | |
|---|---|---|
| 4,564,135 | 1/1986 | Barresi et al. ............... 228/6.2 |
| 4,606,493 | 8/1986 | Christoph et al. ............ 228/219 |
| 4,805,827 | 2/1989 | Coffman et al. ............. 228/20 |
| 4,844,325 | 7/1989 | Nishiguchi et al. .......... 228/20 |
| 5,065,932 | 11/1991 | Hayden et al. ............... 228/42 |
| 5,193,738 | 3/1993 | Hayes ........................ 228/6.2 |
| 5,222,649 | 6/1993 | Funari et al. ............... 228/6.2 |

*Primary Examiner*—Samuel M. Heinrich
*Attorney, Agent, or Firm*—Mark L. Mollon; Roger L. May

[57] ABSTRACT

A gas flow distribution system for a solder dispensing head includes a base member adapted to be connected to the solder dispensing head and a structure connected to a source of an inert gas for distributing at least one continuous stream of the inert gas radially and axially below the solder dispensing head to exclude oxygen in the surrounding air therefrom.

20 Claims, 3 Drawing Sheets

GAS FLOW DISTRIBUTION SYSTEM FOR MOLTEN SOLDER DISPENSING PROCESS

BACKGROUND OF THE INVENTION

1. Field of the Invention

The present invention relates generally to a system for soldering and, more specifically, to a gas flow distribution system for a molten solder dispensing process.

2. Description of the Related Art

It is known to use a molten solder dispensing process for dispensing beads of molten solder onto electronic circuit board components to solder leads of the components to conductive surfaces of a circuit board. It is also known to provide a system for the molten solder dispensing process. This system typically includes a solder dispensing head having a solder feed orifice and an interior bore sized to receive an elongated heat source for contacting solid solder fed within the interior bore through the solder feed orifice. The interior bore of the solder dispensing head also includes a solder reservoir for molten solder and a tip opening for depositing the molten solder onto the components and circuit board. The solder dispensing head also includes a bleed gas port which communicates with the interior bore and is connected to a source of an inert gas such as nitrogen to exclude oxygen in the surrounding air from entering the tip opening of the solder dispensing head and oxidizing the molten solder.

One disadvantage of the above solder dispensing head is that it applies solder drops on only one lead at a time. Another disadvantage is that the solder dispensing head may use solder fluxes which is undesirable. Yet another disadvantage is that the solder dispensing head uses discrete nozzles to introduce the nitrogen. A further disadvantage is that the nitrogen is cold and serves to cool the solder dispensing head which is undesired

SUMMARY OF THE INVENTION

Accordingly, the present invention is a gas flow distribution system for a solder dispensing head including a base member adapted to be connected to a solder dispensing head. The gas flow distribution system also includes manifold means connected to a source of an inert gas for distributing at least one continuous stream of the inert gas radially and axially below the solder dispensing head to exclude oxygen in the surrounding air therefrom.

One feature of the present invention is that a gas flow distribution system is provided for a molten solder dispensing process. Another feature of the present invention is that the gas flow distribution system provides continuous streams of an inert gas such as nitrogen from both the interior and the exterior to purge the air of oxygen from below the solder dispensing head to prevent the oxidization of the molten solder droplets Yet another feature of the present invention is that the gas flow distribution system virtually eliminates oxygen below the solder dispensing head, thereby eliminating the need for either a nitrogen enclosure to facilitate the solder dispensing process or solder fluxes. Still another feature of the present invention is that the gas flow distribution system provides heated nitrogen streams which serves to pre-heat the conductive surfaces of the circuit board and leads of the circuit board components, thereby allowing the formation of effective solder joints A further feature of the present invention is that the gas flow distribution system ensures uniform, radial flow and minimizes disturbance to solder droplet formation. Yet a further feature of the present invention is that the gas flow distribution system purges a large region below the solder dispensing head to allow multiple solder droplets (e.g. 256 or more) to be dispensed simultaneously. A still further feature of the present invention is that the gas flow distribution system reduces oxygen levels below the solder dispensing head from about 200,000 parts per million (ppm) to about 20 ppm.

Other features and advantages of the present invention will be readily appreciated as the same becomes better understood after reading the subsequent description taken in conjunction with the accompanying drawings.

DESCRIPTION OF THE PREFERRED EMBODIMENTS(S)

Figure 1:
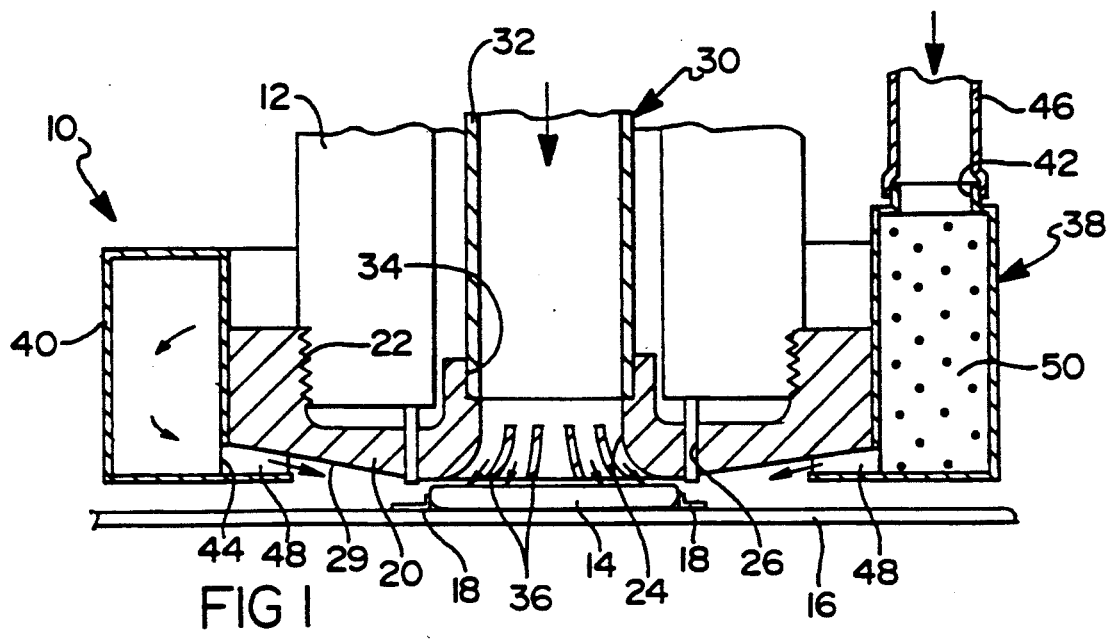
FIG. 1 is a partial fragmentary elevational view of a gas flow distribution system, according to the present invention, illustrated in operational relationship to a solder dispensing head, circuit board component and circuit board.

Referring to FIG. 1, a gas flow distribution system 10 is shown in operational relationship to a solder dispensing head 12, circuit board component 14 and circuit board 16. The gas flow distribution system 10 is attached to the solder dispensing head 12 (partially shown) for dispensing droplets of molten solder to solder leads 18 of the circuit board component 14 to conductive surfaces of the circuit board 16. The gas flow distribution system 10 is used to purge atmospheric oxygen from below the solder dispensing head 12 while minimizing disturbance to the solder droplets which are being dispensed. It should be appreciated that the solder dispensing head 12 dispenses multiple solder droplets simultaneously (e.g. 256 or more) and is conventional and known in the art.

Figure 2:
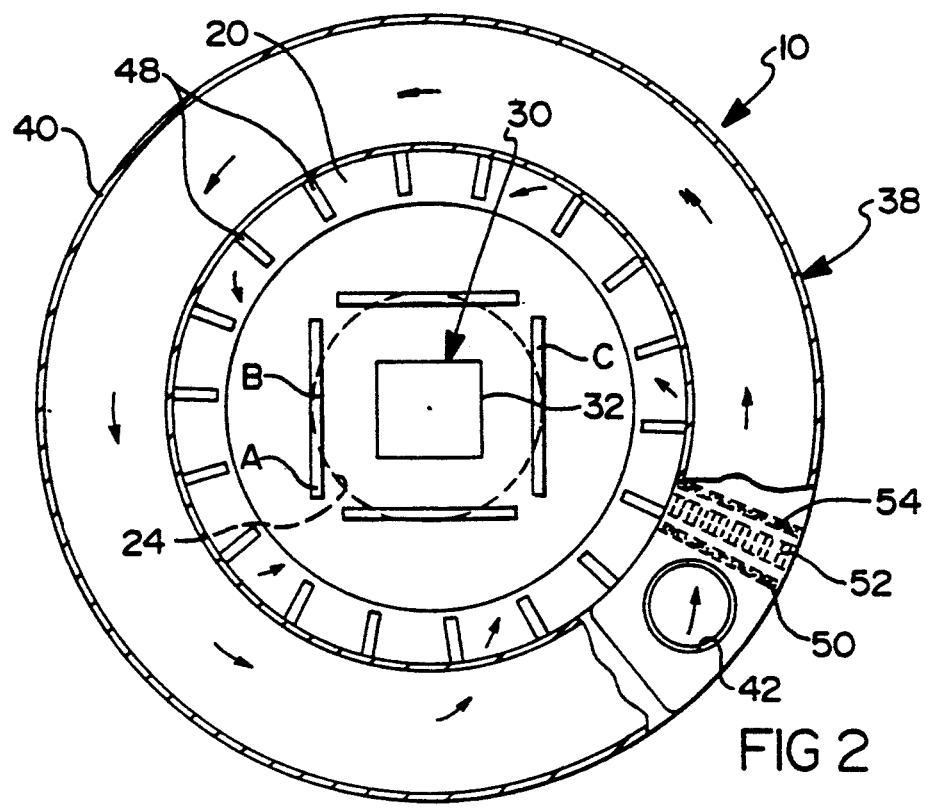
FIG. 2 is a fragmentary plan view of the gas flow distribution system of FIG. 1.

As illustrated in FIGS. 1 and 2, the gas flow distribution system 10 includes a base member 20 which is connected to the solder dispensing head 12 by suitable means such as a threaded connection 22. The base member 20 is generally circular in shape and has a generally circular central aperture 24 extending axially therethrough. The base member 20 also has, at least one, preferably a plurality of solder apertures 26 extending axially therethrough to receive solder of the solder dispensing head 12. The base member 20 also has a chamfer 29 extending from the central aperture 24 to an outer periphery thereof. The chamfer 29 is angled at a predetermined number of degrees such as fifteen degrees (15°) from the horizontal to provide a more compact design. It should be appreciated that molten solder passes through the solder apertures 26 from the solder dispensing head 12 to solder a plurality of leads 18 to the circuit board 16 at the same time. It should also be appreciated that the solder dispensing head 12 may be connected to a robotic arm (not shown).

The gas flow distribution system 10 also includes an inner flow distribution manifold, generally indicated at 30, for introducing an inner continuous stream of an inert gas into a region below the solder dispensing head 12. The inner flow distribution manifold 30 includes a central tube 32 having a generally square cross-sectional shape. The central tube 32 extends into a recess 34 about an inlet of the central aperture 24 of the base member 20. The central tube 32 is connected to a source of an inert gas such as nitrogen. It should be appreciated that a heater (not shown) is disposed in the inlet of the supply line to heat the inner stream and eliminate the use of fluxes.

The inner flow distribution manifold 30 also includes a plurality of directional guide vanes 36 spaced circumferentially about an outlet of the central aperture 24 to introduce the stream of the inert gas in the radial and axial directions over the circuit board component 14. The outlet of the central aperture 24 and directional guide vanes 36 have a fifteen degree (15°) chamfer. Preferably, two (2) directional guide vanes 36 are used and have a generally rectangular annular shape. It should be appreciated that the angle and geometry of the directional guide vanes 36 can be varied to provide contoured guide vanes. It should also be appreciated that the central tube 32 and directional guide vanes 36 may have any suitable cross-sectional shape such as circular.

The gas flow distribution system 10 further includes an outer flow distribution manifold, generally indicated at 38, for introducing an outer continuous stream of the inert gas into the region below the solder dispensing head 12. The outer flow distribution manifold 38 has an outer tube 40 which is generally annular in shape and extends along the outer circumference of the base member 20. The outer tube 40 has a generally rectangular cross-sectional shape and whose cross-sectional area is decreased more or less linearly along the flow direction around the circumference such as from 2.56 square inches to 0.5 square inches, in order to maintain uniform gas flow and discharge pressure therein thereby insuring uniform radial-flow discharge. The outer tube 40 has an inlet 42 at an upper portion thereof and an outlet 44 at a lower portion thereof. The inlet 42 is generally circular in shape and is connected to a source of an inert gas such as nitrogen by a tube 46 attached thereto. The inlet 42 may be positioned axially or radially in the upper portion of the outer tube 40. The outlet 44 is generally annular in shape and has a predetermined height such as 0.2 inches. It should be appreciated that the flow rate and temperature of the inert gas streams can be adjusted to minimize or eliminate disturbance to the solder droplets being dispensed.

The outer flow distribution manifold 38 includes a plurality of directional guide vanes 48 disposed adjacent the outlet 44 to introduce the stream of the inert gas axially, as well as radially, onto the circuit board component 14 and circuit board 16. Preferably, twenty-five (25) directional guide vanes 48 are spaced equally around the circumference of the outlet 44. The directional guide vanes 48 are planar plates having a chord-to-gap ratio of 0.5. The directional guide vanes 48 are orientated at an angle of minus five degrees (−5.0°) with the axial and serve to remove swirl present in the gas stream as it exits the outlet 44 of the outer tube 40. It should be appreciated that the decreased cross-sectional area of the outer flow distribution manifold 38 compensates for the reduction in mass caused by the gas flow leaving the manifold 38 and maintains a uniform pressure in the manifold 38.

Preferably, the underside or bottom surface of the outer flow distribution manifold 38 is about 0.6 to 25 millimeters (mm) above the surface of the circuit board 16 while the droplets are being dispensed. This provides a passage for the gas flow outward, thereby preventing the diffusion of ambient oxygen toward the solder dispensing area. It should be appreciated that the oxygen levels (ppm) are sensitive to height.

The gas flow distribution system 10 may include a perforated plate 50, honeycomb 52 and a screen 54 disposed in the outer tube 40 after the inlet 42 thereof. The perforated plate 50, honeycomb 52, and screen 54 are used to damp out turbulence and maintain laminar flow of the inert gas in the outer tube 40. It should be appreciated that the perforated plate 50, honeycomb 52 and screen 54 are optional.

In operation, heated inert gas flows through the central tube 32 of the inner flow distribution manifold 30 and is guided by the directional guide vanes 36 radially and axially onto the circuit board component 14. Inert gas (usually hot) flows through the tube 46 and enters the inlet 42 of the outer flow distribution manifold 38. The inert gas flows around the outer tube 40 as indicated by the arrows and exits the outlet 44 where it is guided by the directional guide vanes 48 radially and axially onto the circuit board component 14 and circuit board 16. It should be appreciated that the inner and outer continuous streams of the inert gas exclude oxygen in the air from below the solder dispensing head 12 while the solder droplets are being dispensed.

The following is an example of oxygen levels in parts per million (ppm) below the solder dispensing head 12 indicated at locations A, B and C of FIG. 2:

TABLE 1

Oxygen levels in parts per million (ppm) below
Solder Dispensing Head 12
Height of solder dispensing head 12 above circuit board 16
is 0.25 in.
Inner stream temp. = 250 deg C.
Outer stream temp. = 250 deg C.
Location A: Near entrance, edge of solder dispensing head 12
Location B: Near entrance, middle of solder dispensing head 12
Location C: Away from entrance, edge of solder dispensing head 12

| At location A: | | | At location B: | | | At location C: | | |
|---|---|---|---|---|---|---|---|---|
| Qo cfh | Qi cfh | O2 ppm | Qo cfh | Qi cfh | O2 ppm | Qo cfh | Qi cfh | O2 ppm |
| 0 | 40 | 80–160 | 0 | 60 | 44–50 | 0 | 60 | 50–150 |
| 0 | 60 | 90–140 | 30 | 10 | 35–45 | 30 | 10 | 42–58 |
| 60 | 0 | 150–550 | 30 | 20 | 21–26 | 30 | 20 | 31–45 |
| 30 | 10 | 40–60 | 100 | 60 | 24–30 | 100 | 60 | 24–33 |
| 100 | 60 | 35–45 | 60 | 100 | 35 | 60 | 100 | 48 |

Contamination level of Nitrogen used for purging: 15–18 ppm

Figure 3:
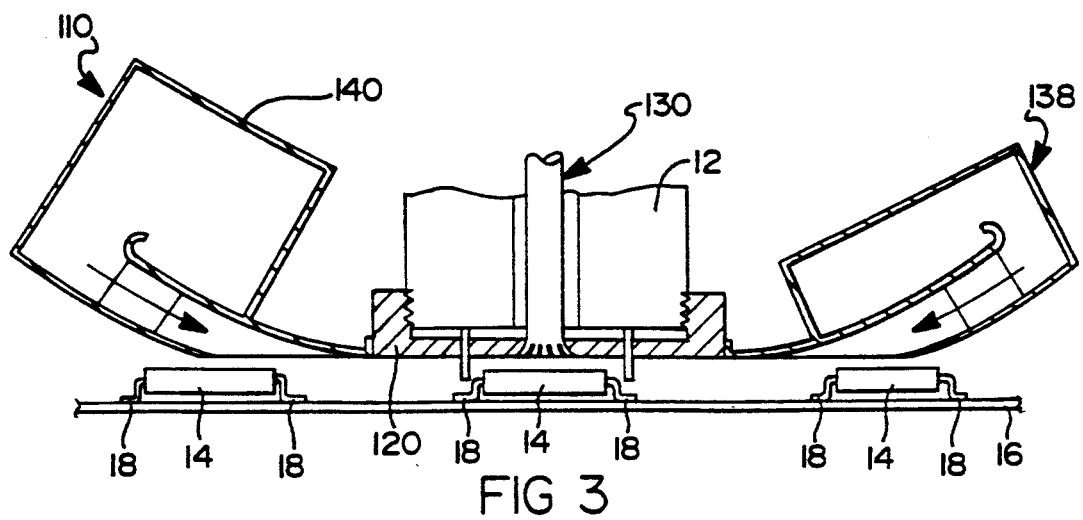
FIG. 3 is a partial fragmentary elevational view of a first alternate embodiment of the gas flow distribution system of FIGS. 1 and 2.

Referring to FIG. 3, a first alternate embodiment 110 of the gas flow distribution system 10 is shown. Like parts of the gas flow distribution system 10 have like reference numerals increased by one hundred (100). The gas flow distribution system 110 has the outer tube 140 of the outer flow distribution manifold 138 extending radially and axially arcuately away from the base member 120 to present a plane having a predetermined clearance such as 0.375 inches above the circuit board 16 for the circuit components 14. This allows for a flush design for tangential entry of gas flow and minimizes up and down movement and interference with adjacent components.

Figure 4:
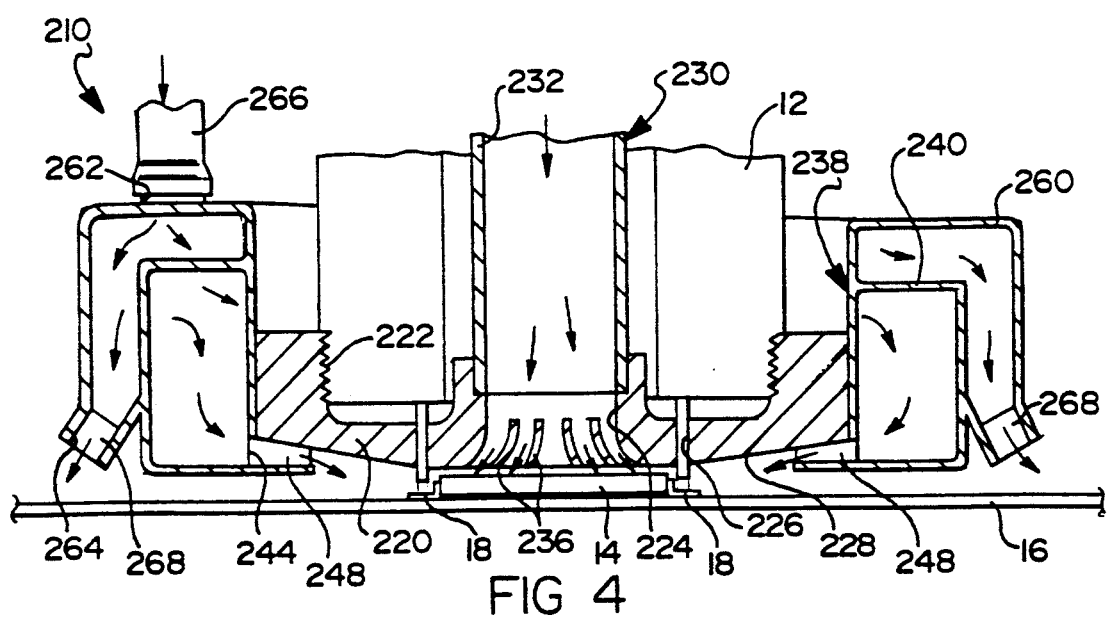
FIG. 4 is a partial fragmentary elevational view of a second alternate embodiment of the gas flow distribution system of FIGS. 1 and 2.

Referring to FIG. 4, a second alternate embodiment 210 of the gas flow distribution system 10 is shown. Like parts of the gas flow distribution system 10 have like reference numerals increased by two hundred (200). The gas flow distribution system 210 has the outer flow distribution manifold 238 providing dual streams of gas flow. The outer flow distribution manifold 238 has the outer tube 240 extending along the circumference of the base member 220 and an exterior tube 260 extending along the circumference of the outer tube 240. The exterior tube 260 is generally annular in shape and has a generally inverted "L" cross-sectional shape whose cross-sectional area decreases more or less linearly along the flow direction around the circumference such as from 0.55 square inches to 0.25 square inches.

The exterior tube 260 has an inlet 262 at an upper portion thereof and an outlet 264 at a lower portion thereof. The inlet 262 is generally circular in shape and is connected to a source of an inert gas such as nitrogen by a tube 266 attached thereto. The exterior tube 260 also has a plurality of directional guide vanes 268 forming a portion of the outlet 264 to introduce the stream of the inert gas axially and radially away from the circuit board component 14. Preferably, twenty-five (25) directional guide vanes 268 are spaced equally around the circumference of the outlet 264. The outlet 264 is orientated at an angle such as eighteen degrees (18°) from the vertical or axial. The directional guide vanes 268 are planar plates having a chord-to-gap ratio of 0.5 and are orientated at an angle of minus five degrees ($-5°$) from the vertical or axial. The exterior tube 260 provides an opposing stream of inert gas to prevent disturbance of the gas flow to the solder droplets.

In the gas flow distribution system 210, the outer tube 240 may have an opening (not shown) to allow inert gas from the exterior tube 260 to enter the outer tube 240 and exit through the outlet 244. Alternatively, an elliptical or airfoil shaped tube (not shown) may be inserted into the inlet 262 of the exterior tube 260 for directing inert gas flow one way into the exterior tube 260 and the other way into the outer tube 240.

In operation of the gas flow distribution system 210, heated inert gas flows through the central tube 232 of the interior flow distribution manifold 230 and is guided by the directional guide vanes 236 radially and axially onto the circuit board component 14. Heated inert gas also flows through the outer tube 240 of the outer flow distribution manifold 238. Cold inert gas flows through the tube 266 and enters the inlet 262 of the outer flow distribution manifold 238. The cold inert gas flows around the exterior tube 260 as indicated by the arrows and exits the outlet 264 where it is guided radially and axially away from the circuit board component 14 by the directional guide vanes 268. The heated inert gas also flows around the outer tube 240 as indicated by the arrows and exits the outlet 244 where it is guided radially and axially toward the circuit board component 14 by the directional guide vanes 248. It should be appreciated that the stream of inert gas in the outer tube 240 may also be heated.

Figure 5:
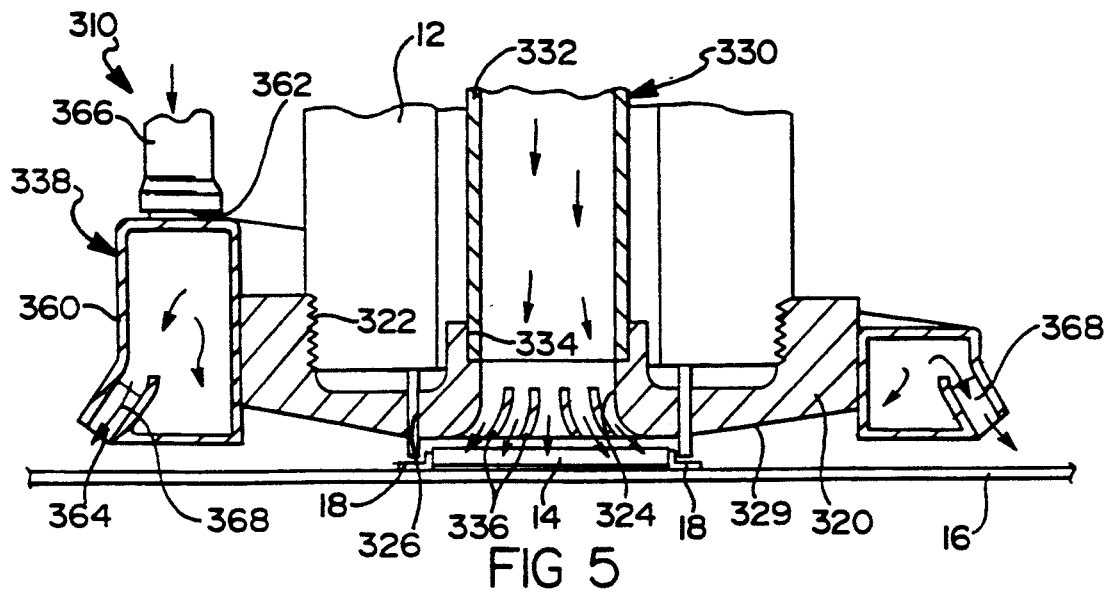
FIG. 5 is a partial fragmentary elevational view of a third alternate embodiment of the gas flow distribution system of FIGS. 1 and 2.

Referring to FIG. 5, a third alternate embodiment 310 of the gas flow distribution system 10 is shown. Like parts of the gas flow distribution system 10 have like reference numerals increased by three hundred (300). The gas flow distribution system 310 has the outer flow distribution manifold 338 providing a single stream of gas flow. The outer flow distribution manifold 338 has an exterior tube 360 extending along the circumference of the base member 320. The exterior tube 360 is generally annular in shape and has a generally rectangular cross-sectional shape whose cross-sectional area decreases more or less linearly along the flow direction around the circumference such as from 2.56 square inches to 0.5 square inches.

The exterior tube 360 has an inlet 362 at an upper portion thereof and an outlet 364 at a lower portion thereof. The inlet 362 is generally circular in shape and is connected to a source of an inert gas such as nitrogen by a tube 366 attached thereto. The exterior tube 360 also has a plurality of directional guide vanes 368 in the outlet 364 to introduce the stream of the inert gas axially and radially away from the circuit board component 14. Preferably, twenty-five (25) directional guide vanes 368 are spaced equally around the circumference of the outlet 364. The outlet 364 is orientated at an angle such as twenty-two degrees (22°) from the vertical or axial. The directional guide vanes 368 are planar plates having a chord-to-gap ratio of 0.5 and are orientated at an angle of minus five degrees ($-5.0°$) from the vertical or axial. The exterior tube 360 provides an opposing stream of inert gas to prevent disturbance of the gas flow to the solder droplets.

In operation of the gas flow distribution system 310, heated inert gas flows through the central tube 332 of the interior flow distribution manifold 330 and is guided by the directional guide vanes 336 radially and axially onto the circuit board component 14. Cold inert gas flows through the tube 366 and enters the inlet 362 of the outer flow distribution manifold 338. The cold inert gas flows around the exterior tube 360 as indicated by the arrows and exits the outlet 364 where it is guided radially and axially away from the circuit board component 14.

Figure 6:
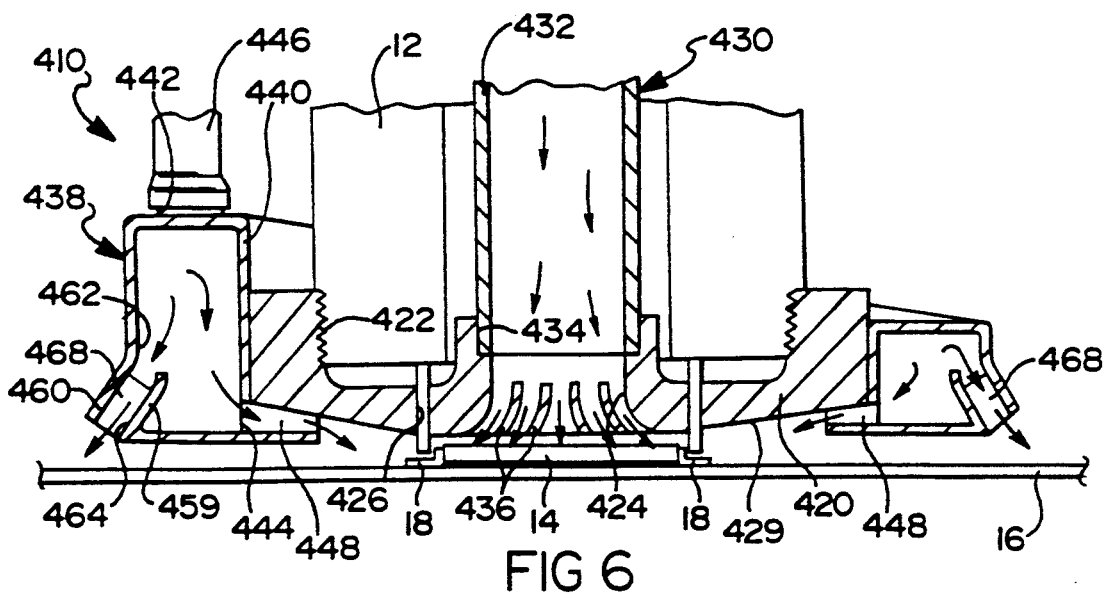
FIG. 6 is a partial fragmentary elevational view of a fourth alternate embodiment of the gas flow distribution system of FIGS. 1 and 2.

Referring to FIG. 6, a fourth alternate embodiment 410 of the gas flow distribution system 10 is shown. Like parts of the gas flow distribution system 10 have like reference numerals increased by four hundred (400). The gas flow distribution system 410 has the outer flow distribution manifold 438 providing dual streams of gas flow. The outer flow distribution manifold 438 has the outer tube 440 extending along the circumference of the base member 420 and a wall 459 forming an exterior tube 460 extending along the circumference of the outer tube 440.

The outer tube 440 has an inlet 442 at an upper portion thereof and an outlet 444 at a lower portion thereof. The inlet 442 is generally circular in shape and is connected to a source of an inert gas such as nitrogen by a tube 446 attached thereto. The exterior tube 460 has an inlet 462 at an upper portion thereof and an outlet 464 at a lower portion thereof. The exterior tube 460 also has a plurality of directional guide vanes 468 forming a portion of the outlet 464 to introduce the stream of the inert gas axially and radially away from the circuit board component 14. Preferably, twenty-five (25) directional guide vanes 468 are spaced equally around the circumference of the outlet 464. The directional guide vanes 468 are planar plates having a chord-to-gap ratio of 0.5 and are orientated at an angle of minus five degrees ($-5°$) from the vertical or axial. The exterior tube 460 provides an opposing stream of inert gas to prevent disturbance of the gas flow to the solder droplets.

In operation of the gas flow distribution system 410, heated inert gas flows through the central tube 432 of the interior flow distribution manifold 430 and is guided by the directional guide vanes 436 radially and axially onto the circuit board component 14. Cold inert gas flows through the tube 446 and enters the inlet 442 of the outer flow distribution manifold 438. The cold inert gas flows around the exterior tube 460 as indicated by the arrows and exits the outlet 464 where it is guided radially and axially away from the circuit board component 14 by the directional guide vanes 468. The cold inert gas also flows around the outer tube 440 as indicated by the arrows and exits the outlet 444 where it is guided radially and axially toward the circuit board component 14 by the directional guide vanes 448.

Accordingly, the gas flow distribution system 10 reduces oxygen levels in the ambient air below the solder dispensing head 12 from 200,000 ppm to less than about 20 ppm. This is accomplished by the interior and outer flow distribution manifolds while ensuring minimal disturbance to the solder droplets being dispensed onto the leads 18 of the circuit board component 14 by the streams of the inert gas. The gas flow distribution system 10 also provides radial streams that emanate from continuous annular passages on the inner and outer periphery of the solder dispensing head 12.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A gas flow distribution system for a solder dispensing head comprising:
    a base member adapted to be connected to a solder dispensing head; and
    an interior manifold connected to said base member and a source of an inert gas;
    an outer manifold connected to said base member and the source of the inert gas; and
    manifold means for distributing at least one continuous stream of the inert gas radially and axially below the solder dispensing head to exclude oxygen in the surrounding air therefrom.

2. A gas flow distribution system as set forth in claim 1 wherein said manifold means comprises an interior manifold extending through the solder dispensing head.

3. A gas flow distribution system as set forth in claim 2 wherein said manifold means is a central tube having a generally rectangular cross-sectional shape.

4. A gas flow distribution system as set forth in claim 3 wherein said base member has a central aperture extending therethrough, said central aperture being connected to said central tube.

5. A gas flow distribution system as set forth in claim 4 wherein said interior manifold has at least one directional guide vane disposed in an outlet of said central aperture.

6. A gas flow distribution system as set forth in claim 5 wherein said at least one directional guide vane and the outlet of said central aperture have a chamfer of a predetermined number of degrees.

7. A gas flow distribution system as set forth in claim 4 wherein said base member has a chamfer extending radially and axially away from said central aperture to an outer periphery thereof.

8. A gas flow distribution system as set forth in claim 1 wherein said manifold means comprises an outer manifold extending along a circumference of said base member.

9. A gas flow distribution system as set forth in claim 8 wherein said outer manifold is an outer tube having a cross-sectional area that decreases linearly along the direction of gas flow.

10. A gas flow distribution system as set forth in claim 8 wherein said outer manifold is an outer tube having a generally rectangular cross-sectional shape.

11. A gas flow distribution system as set forth in claim 8 wherein said outer manifold is an outer tube having an inlet at an upper portion thereof and an outlet at a lower portion thereof.

12. A gas flow distribution system as set forth in claim 11 wherein said outer manifold has a plurality of directional guide vanes spaced circumferentially adjacent said outlet.

13. A gas flow distribution system as set forth in claim 8 wherein said manifold means includes an exterior tube extending along a circumference of either one of said outer manifold and said base member.

14. A gas flow distribution system as set forth in claim 13 wherein said exterior tube has a cross-sectional area that decreases linearly along the direction of gas flow.

15. A gas flow distribution system as set forth in claim 13 wherein said exterior tube has a generally rectangular cross-sectional shape.

16. A gas flow distribution system as set forth in claim 13 wherein said exterior tube has an inlet at an upper portion thereof and an outlet at a lower portion thereof.

17. A gas flow distribution system as set forth in claim 16 wherein said exterior tube has a plurality of directional guide vanes spaced circumferentially adjacent said outlet.

18. A gas flow distribution system as set forth in claim 8 wherein said outer manifold is an annular outer tube extending radially and axially away from an outer periphery of said base member.

19. A gas flow distribution system for a solder dispensing head comprising:
    a base member adapted to be connected to a solder dispensing head;
    an interior manifold connected to said base member and a source of an inert gas;
    an outer manifold connected to said base member and the source of the inert gas; and
    means for distributing continuous streams of the inert gas from said interior manifold and outer manifold radially and axially to exclude oxygen in the surrounding air from below the solder dispensing head.

20. A gas flow distribution system for a solder dispensing head comprising:
    a base member adapted to be connected to a solder dispensing head;
    an interior manifold extending through the solder dispensing head and connected to a source of an inert gas;
    an outer manifold extending along a circumference of said base member and connected to the source of the inert gas;

said base member is annular and has a central aperture extending therethrough, said central aperture being connected to said central tube;

said interior manifold having at least one directional guide vane disposed in an outlet of said central aperture;

said outer tube having a generally rectangular cross-sectional shape and a cross-sectional area that decreases linearly along the direction of gas flow;

said outer tube having an inlet at an upper portion thereof and an outlet at a lower portion thereof; and said outer manifold having a plurality of directional guide vanes spaced circumferentially adjacent said outlet to exclude oxygen in the surrounding air from below the solder dispensing head.

* * * * *